United States Patent
Dictus et al.

(10) Patent No.: US 11,854,792 B2
(45) Date of Patent: Dec. 26, 2023

(54) SYSTEMS AND METHODS FOR PREVENTING STICTION OF HIGH ASPECT RATIO STRUCTURES AND/OR REPAIRING HIGH ASPECT RATIO STRUCTURES

(71) Applicant: LAM RESEARCH AG, Villach (AT)

(72) Inventors: Dries Dictus, Villach (AT); Ta-Yu Lo, Villach (AT)

(73) Assignee: LAM RESEARCH AG, Villach (AT)

( * ) Notice: Subject to any disclaimer, the term of this patent is extended or adjusted under 35 U.S.C. 154(b) by 298 days.

(21) Appl. No.: 16/757,732

(22) PCT Filed: Oct. 11, 2018

(86) PCT No.: PCT/US2018/055436
§ 371 (c)(1),
(2) Date: Apr. 20, 2020

(87) PCT Pub. No.: WO2019/083735
PCT Pub. Date: May 2, 2019

(65) Prior Publication Data
US 2021/0193456 A1 Jun. 24, 2021

Related U.S. Application Data

(60) Provisional application No. 62/575,705, filed on Oct. 23, 2017.

(51) Int. Cl.
*H01L 21/02* (2006.01)
*H01L 21/67* (2006.01)
(Continued)

(52) U.S. Cl.
CPC ........ *H01L 21/02057* (2013.01); *B08B 3/022* (2013.01); *B08B 9/0813* (2013.01);
(Continued)

(58) Field of Classification Search
None
See application file for complete search history.

(56) References Cited

U.S. PATENT DOCUMENTS 5,489,553 A * 2/1996 Chen ................. H01L 21/31051
257/E21.243
5,954,911 A * 9/1999 Bergman ............. C23C 16/4481
34/523
(Continued)

FOREIGN PATENT DOCUMENTS

| CN | 102714155 A | 10/2012 |
| CN | 102741984 A | 10/2012 |

(Continued)

OTHER PUBLICATIONS

International Search Report and Written Opinion of the ISA issued in PCT/US2018/055436, dated Jan. 30, 2019; ISA/KR.
(Continued)

*Primary Examiner* — Spencer E. Bell
*Assistant Examiner* — Omair Chaudhri

(57) ABSTRACT

A method for treating high aspect ratio (HAR) structures arranged on a surface of a substrate includes a) spin rinsing the surface of the substrate using a first rinsing liquid; b) spinning off the first rinsing liquid from the surface of the substrate; and c) directing a gas mixture containing hydrogen fluoride onto the surface of the substrate after the first rinsing liquid is dispensed.

18 Claims, 7 Drawing Sheets

(51) Int. Cl.
  *H01L 21/687* (2006.01)
  *B08B 3/02* (2006.01)
  *B08B 13/00* (2006.01)
  *B08B 9/08* (2006.01)

(52) U.S. Cl.
  CPC .......... *B08B 13/00* (2013.01); *H01L 21/6704* (2013.01); *H01L 21/67051* (2013.01); *H01L 21/67115* (2013.01); *H01L 21/68764* (2013.01)

(56) References Cited

U.S. PATENT DOCUMENTS

| | | | | |
|---|---|---|---|---|
| 6,092,539 | A * | 7/2000 | Chang | B08B 3/04 134/100.1 |
| 6,485,531 | B1 | 11/2002 | Schob | |
| 8,440,573 | B2 | 5/2013 | Mikhaylichenko et al. | |
| 8,617,993 | B2 | 12/2013 | Yasseri et al. | |
| 8,926,788 | B2 | 1/2015 | Hohenwarter | |
| 9,484,229 | B2 | 11/2016 | Lach et al. | |
| 10,446,416 | B2 | 10/2019 | Mui et al. | |
| 2002/0096196 | A1 * | 7/2002 | Toshima | B08B 3/10 134/36 |
| 2002/0160606 | A1 * | 10/2002 | Siefering | B08B 7/00 438/689 |
| 2004/0020513 | A1 | 2/2004 | Bergman | |
| 2004/0259370 | A1 * | 12/2004 | Bergman | B81C 1/0092 438/708 |
| 2005/0115671 | A1 * | 6/2005 | Araki | H01L 21/31116 257/E21.228 |
| 2005/0121053 | A1 * | 6/2005 | Lee | B08B 3/08 134/33 |
| 2006/0042664 | A1 * | 3/2006 | Hardikar | H01L 21/67051 134/32 |
| 2006/0076034 | A1 | 4/2006 | Nam et al. | |
| 2006/0138539 | A1 * | 6/2006 | Stadler | H01L 21/3065 257/347 |
| 2006/0196527 | A1 * | 9/2006 | Nishimura | H01L 21/67184 134/28 |
| 2007/0137677 | A1 * | 6/2007 | Nanba | H01L 21/02057 134/33 |
| 2007/0175393 | A1 * | 8/2007 | Nishimura | H01J 37/32192 156/345.33 |
| 2007/0277930 | A1 * | 12/2007 | Yokoyama | H01L 21/67051 156/345.31 |
| 2008/0053486 | A1 * | 3/2008 | Tang | B08B 3/02 134/28 |
| 2009/0014033 | A1 * | 1/2009 | Tokuno | H01L 21/67253 134/18 |
| 2009/0032067 | A1 * | 2/2009 | Kojimaru | H01L 21/67034 134/26 |
| 2010/0003807 | A1 * | 1/2010 | Nagaseki | H01L 21/30604 438/758 |
| 2010/0154826 | A1 * | 6/2010 | Printz | H01L 21/67028 134/18 |
| 2010/0163179 | A1 * | 7/2010 | Tozawa | H01L 29/165 156/345.1 |
| 2011/0183522 | A1 | 7/2011 | Mikhaylichenko et al. | |
| 2011/0189858 | A1 | 8/2011 | Yasseri et al. | |
| 2012/0131815 | A1 | 5/2012 | Kraus et al. | |
| 2013/0014785 | A1 * | 1/2013 | Kimura | H01L 21/02057 134/94.1 |
| 2013/0118535 | A1 * | 5/2013 | Lach | H01L 21/67051 137/1 |
| 2013/0174873 | A1 * | 7/2013 | Yoshihara | B08B 5/02 134/21 |
| 2013/0237061 | A1 * | 9/2013 | Takahashi | H01L 21/30604 156/345.29 |
| 2013/0277730 | A1 * | 10/2013 | Jung | H10B 41/43 257/E21.546 |
| 2013/0280123 | A1 | 10/2013 | Chen et al. | |
| 2014/0026926 | A1 | 1/2014 | Semmelrock et al. | |
| 2014/0065295 | A1 * | 3/2014 | Emoto | H01L 21/6708 118/52 |
| 2015/0072533 | A1 * | 3/2015 | Muraki | H01L 21/76897 156/345.35 |
| 2015/0340251 | A1 * | 11/2015 | Wakita | H01L 21/30604 438/748 |
| 2016/0005621 | A1 | 1/2016 | Toda et al. | |
| 2016/0005630 | A1 * | 1/2016 | Fujiwara | H01L 21/6708 438/748 |
| 2016/0086810 | A1 * | 3/2016 | Fujiwara | H01L 21/02052 156/345.21 |
| 2016/0254162 | A1 * | 9/2016 | Okutani | H01L 21/32135 438/702 |
| 2017/0178892 | A1 * | 6/2017 | Sato | H01L 21/68785 |
| 2017/0186599 | A1 * | 6/2017 | Takahashi | H01L 21/30604 |
| 2017/0186620 | A1 * | 6/2017 | Marumoto | H01L 21/6704 |
| 2017/0236703 | A1 * | 8/2017 | Higuchi | H01L 21/32134 134/18 |
| 2018/0025922 | A1 * | 1/2018 | Tsujikawa | H01L 21/67051 134/26 |
| 2018/0047593 | A1 | 2/2018 | Mui et al. | |
| 2018/0061678 | A1 * | 3/2018 | Miura | H01L 21/6715 |
| 2018/0076018 | A1 * | 3/2018 | Otsuji | B08B 3/08 |
| 2018/0200763 | A1 * | 7/2018 | Otsuji | H01L 21/02052 |
| 2018/0286695 | A1 * | 10/2018 | Sako | H01L 21/67017 |
| 2019/0013217 | A1 * | 1/2019 | Marumoto | H01L 21/68764 |
| 2019/0030576 | A1 * | 1/2019 | Hanawa | B08B 7/0014 |
| 2019/0088511 | A1 * | 3/2019 | Tanaka | H01L 21/306 |
| 2019/0176196 | A1 * | 6/2019 | Higuchi | B08B 7/028 |
| 2020/0111674 | A1 * | 4/2020 | Sasahara | H01L 21/0206 |
| 2020/0144081 | A1 * | 5/2020 | Tsujikawa | H01L 21/67253 |
| 2021/0280410 | A1 * | 9/2021 | Otsuji | H01L 21/67103 |

FOREIGN PATENT DOCUMENTS

| | | |
|---|---|---|
| CN | 103081072 A | 5/2013 |
| JP | 08213357 | 8/1996 |
| JP | 08316189 | 11/1996 |
| JP | 2007227764 A * | 9/2007 |
| JP | 201588619 A | 5/2015 |
| JP | 2017118026 A | 6/2017 |
| JP | 2018046260 A | 3/2018 |
| WO | WO-2012165861 A2 | 12/2012 |
| WO | WO-2018051821 A1 | 3/2018 |

OTHER PUBLICATIONS

PCT Collaborative Search and Examination Peer Contribution for PCT/US2018/055436, dated Jan. 14, 2018; ISA/EP.
PCT Collaborative Search and Examination Peer Contribution for PCT/US2018/055436, dated Jan. 17, 2019; ISA/JP.
PCT Collaborative Search and Examination Peer Contribution for PCT/US2018/055436, dated Jan. 23, 2019; ISA/US.
PCT Collaborative Search and Examination Peer Contribution for PCT/US2018/055436, dated Jan. 17, 2019; ISA/CN.
Japanese Notifice of Reason for Refusal for Japnaese Application No. JP2020-542530 dated Nov. 24, 2022.

* cited by examiner

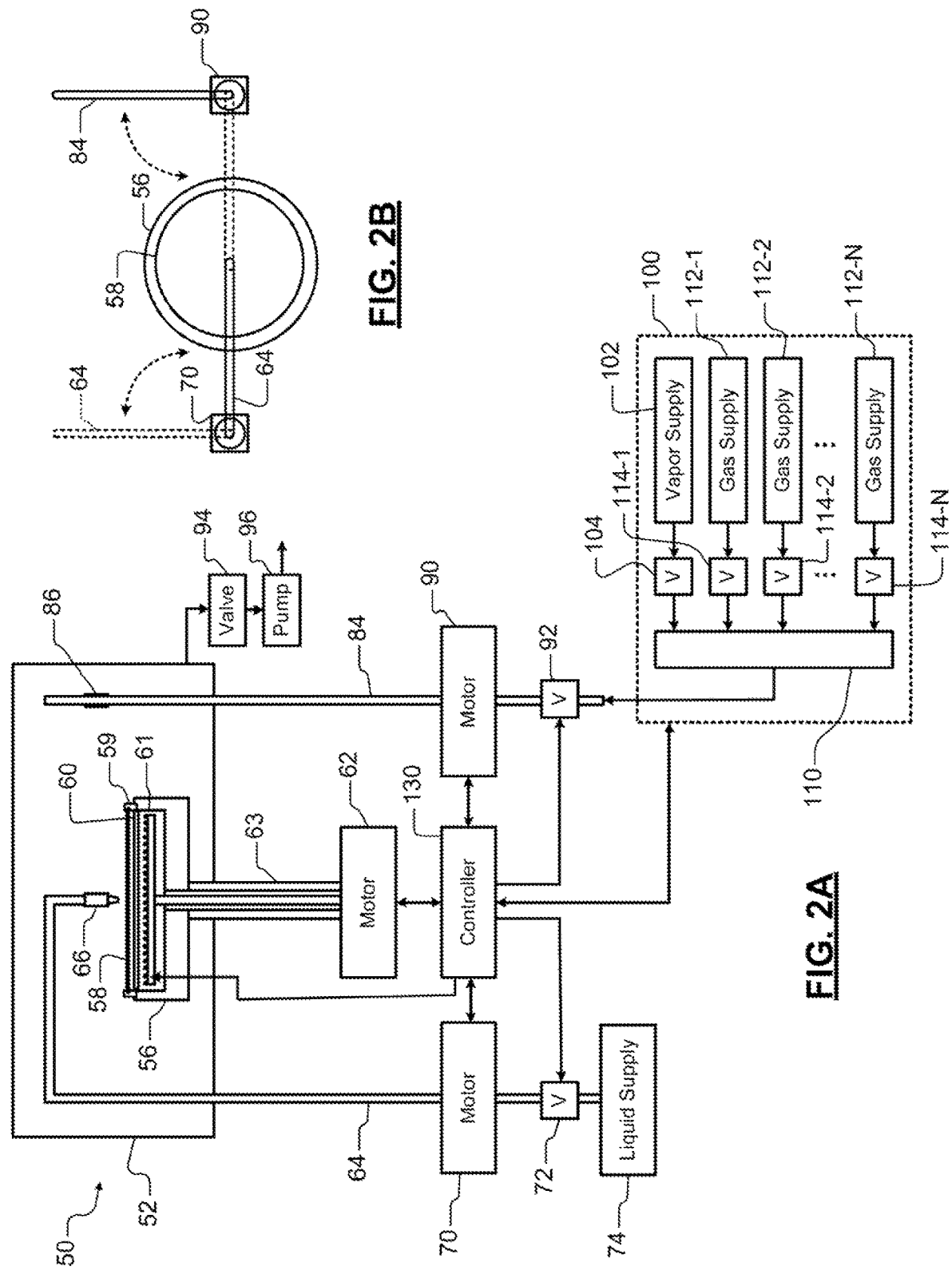

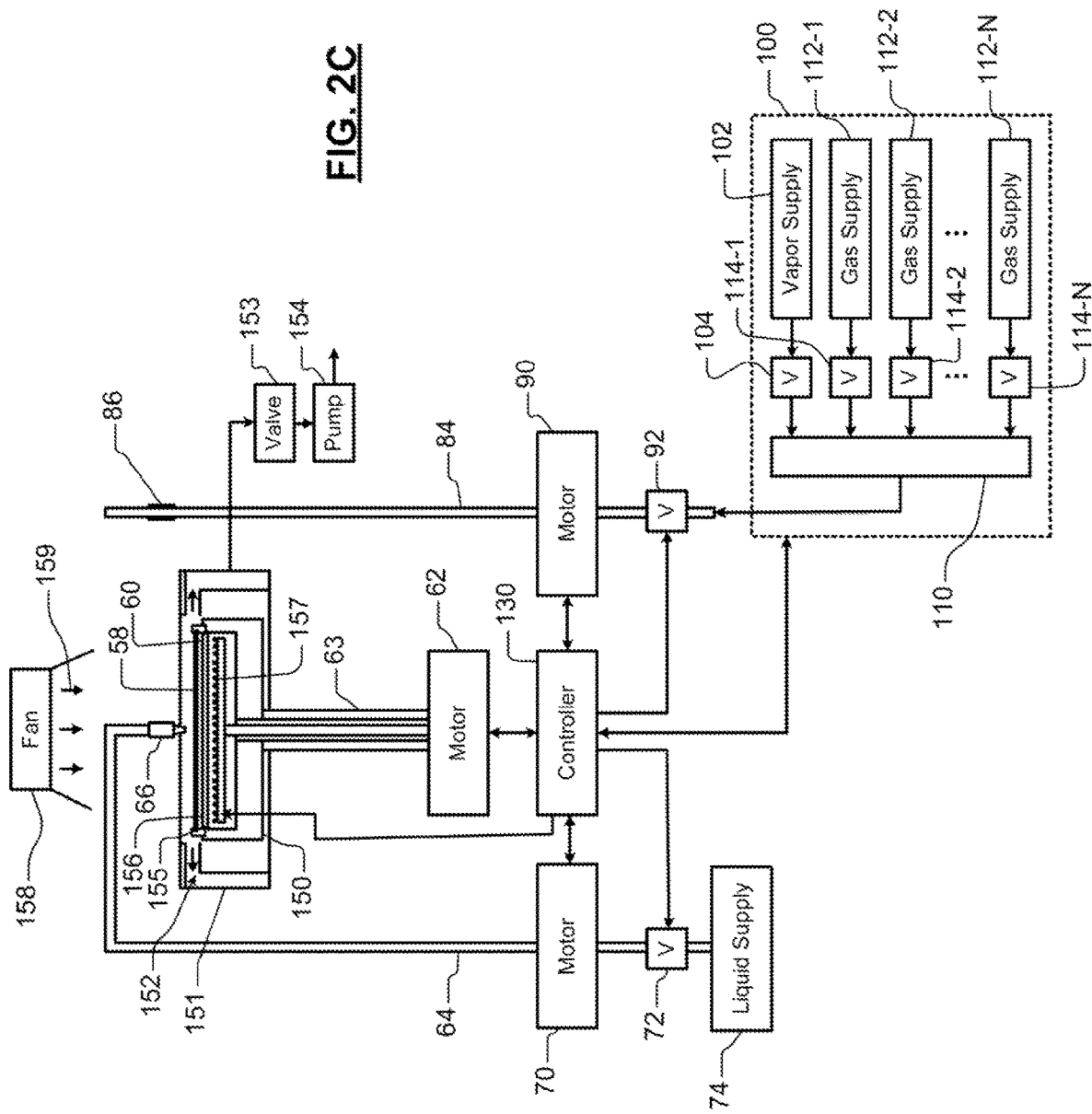

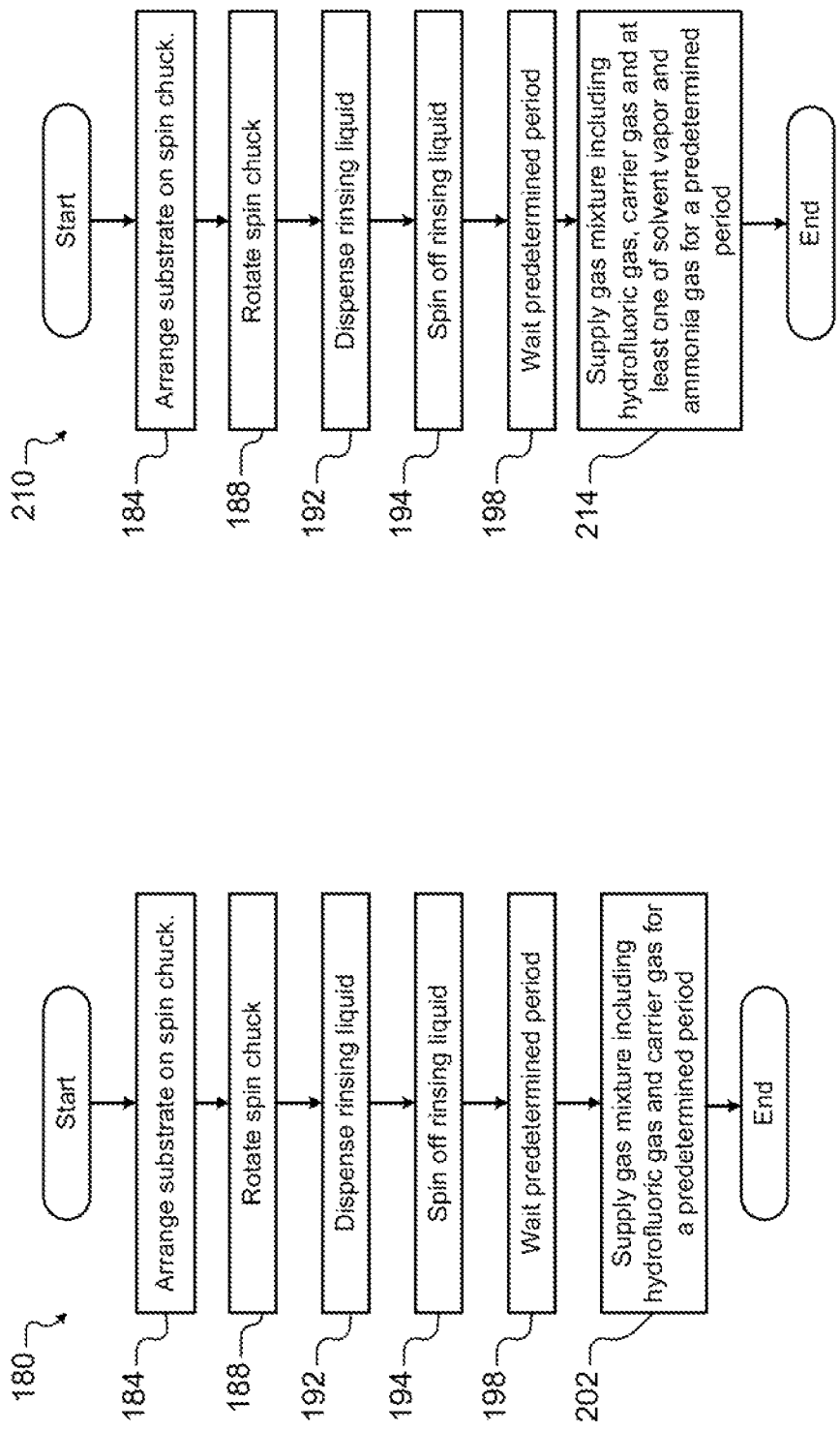

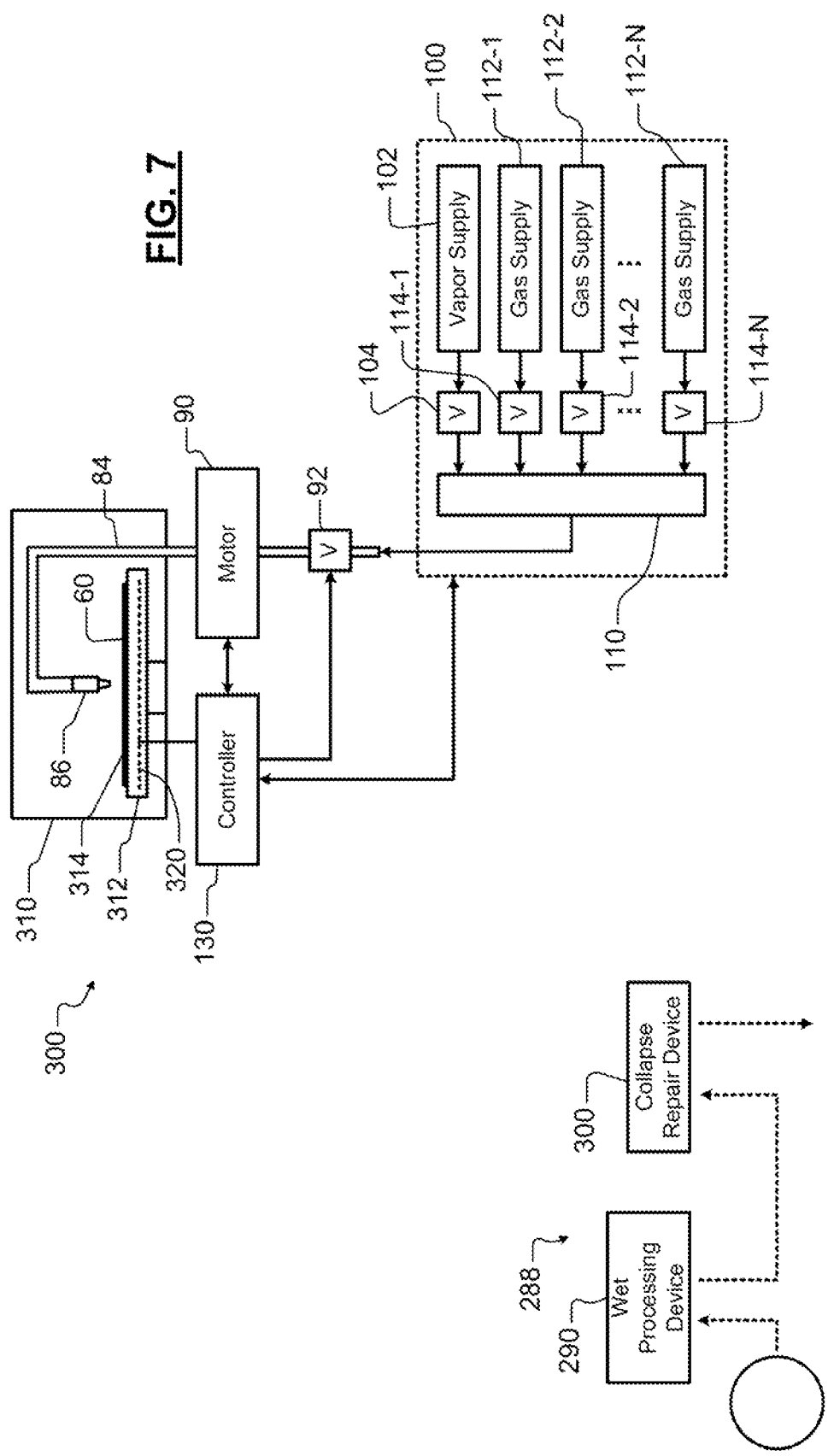

SYSTEMS AND METHODS FOR PREVENTING STICTION OF HIGH ASPECT RATIO STRUCTURES AND/OR REPAIRING HIGH ASPECT RATIO STRUCTURES

CROSS-REFERENCE TO RELATED APPLICATIONS

This application is a U.S. National Phase Application under 35 U.S.C. 371 of International Application No. PCT/US2018/055436, filed on Oct. 11, 2018, which claims the benefit of U.S. Provisional Application No. 62/575,705, filed on Oct. 23, 2017. The entire disclosures of the applications referenced above are incorporated herein by reference.

FIELD

The present disclosure relates to processing of substrates, and more particularly to methods for preventing stiction of high aspect ratio (HAR) structures and/or repairing HAR structures.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit film on a substrate such as semiconductor wafer or to etch, clean and/or otherwise treat the surface of the substrate. In some processes, the substrates may be subjected to wet processing. In these processes, the substrate may be mounted on a rotary chuck. As the rotary chuck is rotated, fluid nozzles may be used to dispense fluid such as a liquid or gas and/or heat may be applied to treat the substrate.

Some of the substrates include high aspect ratio (HAR) structures. For example, the HAR structures may include nanopillars, trenches or vias. The HAR structures have a width (parallel to a surface of the substrate) that is significantly less than a depth (perpendicular to a surface of the substrate) of the feature. HAR structures having an aspect ratio greater than 5:1 are fairly common. More advanced processes include HAR structures having even higher aspect ratios. Pattern collapse occurs when one or more of the HAR structures collapse, move laterally relative to a surface of the substrate and/or directly contact adjacent HAR structures. Pattern collapse is often encountered during drying after a wet clean process Several processes have been used to reduce pattern collapse when drying substrates. For example, the substrate can be dried using supercritical $CO_2$. However, supercritical $CO_2$ is relatively expensive and has implementation issues. The surface of the substrate can be modified with a layer to prevent stiction. However, surface modification is often expensive since it requires extra chemistries to be used. Surface modification also leads to material loss since the modified layer needs to be removed. The substrate can also be dried using isopropyl alcohol (IPA) that is delivered to the surface of the substrate at a temperature close to the boiling point of IPA. However, some aspect ratios cannot be dried using boiling IPA without pattern collapse.

The substrate can also be treated using hydrofluoric (HF) vapor etching in vacuum equipment operated at vacuum pressures. However, the vacuum equipment is typically expensive and cannot be used to perform wet cleaning. The preceding wet clean step is often necessary to remove organic or metal contaminants from the surface of the substrate.

Repairing collapsed structures can be performed using plasma etching in vacuum equipment. However, the plasma etching hardware that is required is expensive.

SUMMARY

A method for treating high aspect ratio (HAR) structures arranged on a surface of a substrate includes a) spin rinsing the surface of the substrate using a first rinsing liquid; b) spinning off the first rinsing liquid from the surface of the substrate; and c) directing a gas mixture containing hydrogen fluoride onto the surface of the substrate after the first rinsing liquid is dispensed.

In other features, the hydrogen fluoride is a first reactive component and the gas mixture further contains a second reactive component. At least one of the second reactive component is a proton acceptor, and/or the second reactive component includes an OH-group.

The second reactive component is selected from a group consisting of water vapor, alcohol vapor, ammonia and amine.

In other features, c) is performed after b) or c) is performed within 60 seconds after a). The gas mixture further contains an inert carrier gas and alcohol vapor. The inert carrier gas includes molecular nitrogen and the alcohol vapor includes isopropyl alcohol. The gas mixture is delivered by a nozzle located in a range from 1 mm to 40 mm from the surface of the substrate. The gas mixture is delivered from the nozzle at a dispense velocity in a range from 1 to 50 m/s. The gas mixture is delivered from the nozzle at a flow rate of 1 to 20 slm.

In other features, a cross-sectional area of an orifice of the nozzle is in a range from 3 to 30 $mm^2$. a), b) and c) are performed at a temperature in a range from 20° C. to 400° C. a), b) and c) are performed at a temperature in a range from 50° C. to 150° C. a), b) and c) are performed when the substrate is maintained at a predetermined pressure in a range from 900 hPa to 1100 hPa. a), b) and c) are performed with the substrate arranged on a rotary chuck of a device.

In other features, the device further comprises a first liquid dispenser connected to a first rinsing liquid source, a vapor supply to supply solvent vapor, and a gas dispenser connected to a gas source and the vapor supply to dispense the gas mixture onto a surface of the substrate. The gas dispenser comprises a showerhead.

In other features, the gas dispenser comprises an arm, a nozzle, and a motor to scan the arm across the substrate while the gas mixture is supplied.

In other features, a), b) and c) are performed at a temperature greater than 100° C. The gas mixture further comprises ammonia.

In other features, the first rinsing liquid comprises an organic, water miscible solvent.

In other features, the gas mixture includes hydrogen fluoride in a range from 0.05% to 10% volume, alcohol in a range from 0.05% to 10% volume, and an inert gas in a range from 80% to 99.9% volume. The gas mixture includes hydrogen fluoride in a range from 0.5% to 5% volume, alcohol in a range from 0.5% to 2.5% volume, and an inert gas in a range from 92.5% to 99% volume. The gas mixture includes hydrogen fluoride in a range from 0.1% to 5% volume, alcohol in a range from 0.1% to 5% volume, and an inert gas in a range from 90% to 99.8% volume.

A device for treating high aspect ratio (HAR) structures arranged on a surface of a substrate includes a rotary chuck to rotate the substrate. A first nozzle rinses the surface of the substrate using a first rinsing liquid as the rotary chuck rotates the substrate. A second nozzle directs a gas mixture containing hydrogen fluoride onto the surface of the substrate after the first rinsing liquid is dispensed.

In other features, a first liquid dispenser is connected to a first rinsing liquid source. A vapor supply supplies a second reactive component. A gas dispenser is connected to a gas source and the vapor supply dispenses the gas mixture onto a surface of the substrate.

In other features, a mixing manifold mixes the hydrogen fluoride and second reactive component. An open chamber surrounds the rotary chuck. A closed chamber surrounds the rotary chuck. A vapor supply supplies solvent vapor. The gas mixture further contains the solvent vapor.

In other features, the solvent vapor is selected from a group consisting of water vapor and alcohol vapor. The second nozzle directs the gas mixture containing hydrogen fluoride onto the surface of the substrate after the first rinsing liquid is spun off the substrate. The second nozzle directs the gas mixture containing hydrogen fluoride onto the surface of the substrate within 60 seconds after the first rinsing liquid is dispensed.

In other features, a heater heats the substrate to a temperature in a range from 20° C. to 400° C. The heater heats the substrate to a temperature in a range from 50° C. to 150° C. The substrate is maintained at a predetermined pressure in a range from 900 hPa to 1100 hPa. A heater to heat the substrate to a temperature greater than 100° C. and the gas mixture further contains ammonia.

In other features, a controller controls rotation of the rotary chuck, dispensing of the first rinsing liquid from the first nozzle and dispensing of the gas mixture from the second nozzle.

In other features, the second nozzle is located in a range from 1 mm to 40 mm from the surface of the substrate. The gas mixture is delivered from the second nozzle at a dispense velocity in a range from 1 to 50 m/s. The gas mixture is delivered from the second nozzle at a flow rate of 1 to 20 slm. A cross-sectional area of an orifice of the second nozzle is in a range from 3 to 30 $mm^2$.

In other features, the gas mixture includes hydrogen fluoride in a range from 0.5% to 5% volume, alcohol in a range from 0.5% to 2.5% volume, and inert gas in a range from 92.5% to 99% volume.

In other features, the gas mixture includes an inert gas in a range from 80% to 99.9% volume, hydrogen fluoride in a range from 0.05% to 10% volume, and alcohol in a range from 0.05% to 10% volume. The gas mixture includes an inert gas in a range from 90% to 99.8% volume, hydrogen fluoride in a range from 0.1% to 5% volume, and alcohol in a range from 0.1% to 5% volume.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2A is a functional block diagram of an example of a rotary chuck arranged in a closed chamber for processing a substrate according to the present disclosure;

FIG. 2B is a plan view of the rotary chuck of FIG. 2A;

FIG. 2C is a functional block diagram of an example of a rotary chuck arranged in an open chamber for processing a substrate according to the present disclosure;

FIG. 4 is a flowchart illustrating an example of a method for processing a substrate according to the present disclosure;

FIG. 5 is a flowchart illustrating another example of a method for processing a substrate according to the present disclosure;

FIG. 6 is a functional block diagram illustrating a wet processing device and a separate collapse repair device according to the present disclosure;

FIG. 7 is a functional block diagram of a collapse repair device utilizing an arm and a nozzle according to the present disclosure.

In the drawings, reference numbers may be reused to identify similar and/or identical elements.

DETAILED DESCRIPTION

Figure 1C:
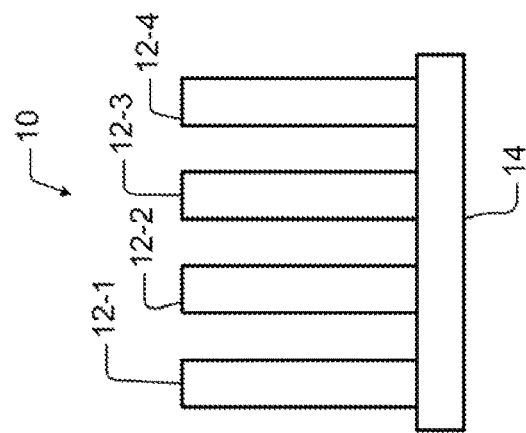
FIGS. 1A-1C are side cross-sectional views illustrating a substrate before and after wet cleaning and drying and after repair according to the present disclosure.

Systems and methods according to the present disclosure relate to wet processing and dry etching of a substrate including high aspect ratio (HAR) structures. The wet processing and dry etching can be performed at or near atmospheric pressure in a wet clean tool after the substrate is processed. The combination of wet processing and dry etching in a single hardware device provides a less expensive alternative to the other drying processes and adds little or no processing time. Alternately, the wet processing can be completed in the wet processing tool and the repair process can be performed in a separate repair tool.

In some examples, after exposure to a rinsing liquid such as isopropyl alcohol (IPA), a gas mixture is dispensed onto the surface of the substrate. The gas mixture includes hydrofluoric (HF) gas. In some examples, the gas mixture may further include a second reactive component (such as a solvent vapor or a proton acceptor or component having an OH-group) and/or a carrier gas.

In some examples, the carrier gas includes an inert gas such as molecular nitrogen ($N_2$). However, other inert gases can be used. In some examples, the second reactive component includes water or alcohol (methanol, IPA, or other alcohol). Other alcohols can be used. For example, an alcohol with 1 to 4 carbon (C) atoms can be used. For example, 2-propanol (IPA) can be used. In some examples, the mixing method for the gases includes mixing $N_2$ with IPA and then adding pure HF gas to the IPA/$N_2$ mixture.

For example, an adsorbed layer of the solvent is formed and $HF_2$ is generated. $SiO_2$ reacts with $HF_2$ and $SiF_4$ is formed, which leads to evaporation (etching) of the $SiO_2$ layer. In some examples, the gas mixture includes HF in a range from 0.5% to 5% volume, alcohol in a range from 0.5% to 2.5% volume, and an inert gas in a range from 92.5% to 99% volume.

In some examples, the gas mixture is generated by flowing $N_2$ gas as a carrier gas through concentrated aqueous HF (with HF concentration in a range from 45% to 55% volume (e.g. 49% volume)). In other examples, the gas mixture is prepared by mixing the inert gas (such as molecular nitrogen) with the alcohol and then adding pure HF to the inert gas and alcohol mixture.

In other examples, the gas mixture includes an inert gas in a range from 80% to 99.9% volume, HF in a range from 0.05% to 10% volume, and alcohol in a range from 0.05% to 10% volume. In other examples, the gas mixture includes an inert gas in a range from 90% to 99.8% volume, HF in a range from 0.1% to 5% volume, and alcohol in a range from 0.1% to 5% volume.

In other examples, ammonia ($NH_3$), or any amine (e.g. ethyl amine, ethylene diamine, pyrrolidine) is optionally added to the gas mixture when the processing temperature is greater than 100° C. Addition of $NH_3$ works in particular at temperatures above 100° C. where formation of $NH_4F$ is inhibited (as it is above the sublimation temperature) and volatile $(NH_4)_2SiF_4$ is formed.

As an alternative, the process can also be applied to the substrate after the rinsing liquid has been spun off the substrate and the substrate is relatively dry. In some examples, the process can include exposure while the rinsing liquid is present and again after the rinsing liquid has been spun off and is dry. The process can be repeated one or more times.

In some examples, the process is performed at or near atmospheric pressures. For example, the substrate surface may be maintained at a pressure in a range from 900 to 1100 hectopascals (hPa) during processing. In some examples, the gas mixture is delivered to the substrate using a nozzle that is scanned across the surface of the substrate. Alternatively, the gas mixture can also be delivered to the substrate using a showerhead arranged above the surface of the substrate. In addition, vapors that can potentially enhance the process such as water or ammonia $NH_3$ vapors (gases) or amines can be supplied.

In some examples, the process is performed at a predetermined temperature in a range from 20° C. to 400° C. In other examples, the process is performed at a predetermined temperature in a range from 50° C. to 150° C. Partial pressures of HF and solvent vapor can be varied between 1 mTorr and up to their respective saturated vapor pressures at the specific process temperature.

Adding a reactive vapor (e.g. HF/solvent vapor combination) to a drying process provides improved results relative to other IPA drying processes. In some examples, controllability of the vapor etching is performed using a substrate heater with radial heating and/or a nozzle that can be scanned over the substrate. In addition to reducing hardware and chemistry costs, the method described herein increases the yield of the process.

Figure 1B:
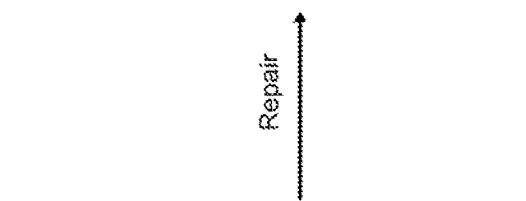
Figure 1A:
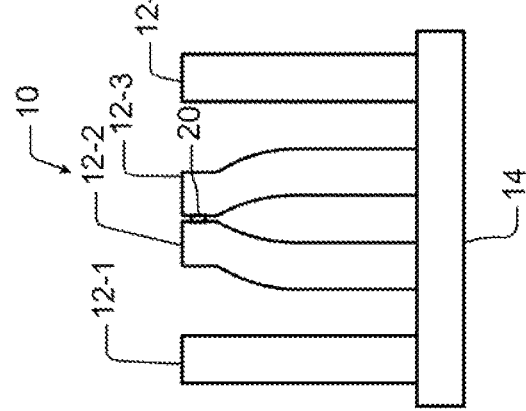

Referring now to FIGS. 1A-1C, processing of a substrate is shown. In FIG. 1A, a substrate 10 is shown prior to wet processing and drying. Substrate 10 includes high aspect ratio (HAR) structures 12-1, 12-2, 12-3 and 12-4 (collectively HAR structures 12) defined on one or more underlying layers 14. For example, the HAR structures 12 include pillars, vias, trenches, and/or other features. The substrate 10 in FIG. 1A is subjected to wet processing and drying.

In FIG. 1B, the substrate 10 is shown after the wet processing and drying. The HAR structures 12-2 and 12-3 partially collapse and lean towards one another. In some examples, a bridging oxide 20 is formed between the HAR structures 12-2 and 12-3. Examples of bridging oxides that may be formed include silicon oxide ($SiO_x$), silicon oxynitride ($SiO_xN_y$), titanium oxide ($TiO_x$), etc. In FIG. 1C, the substrate 10 is shown after treatment using the methods described herein such that the bridging oxide 20 is removed and the collapsed HAR structures 12-2 and 12-3 are repaired.

Referring now to FIG. 2A, an example of a system 50 for wet processing and repairing a substrate is shown. The system 50 includes a chamber 52 housing a rotary chuck 56. A substrate 58 is arranged on a surface of the rotary chuck 56. The rotary chuck 56 rotates the substrate 58 while liquid is dispensed onto the substrate 58 and/or to spin off the liquid. The substrate 58 may be attached to the rotary chuck 56 using any suitable mechanism. For example, the substrate 58 can be attached to the rotary chuck 56 using gripping pins 59. Suitable examples of gripping pins are shown and described in commonly-assigned "Method and Apparatus for Processing Wafer-Shaped Articles", U.S. patent application Ser. No. 15/232,594, which is hereby Incorporated by reference in its entirety.

In some examples, the surface 60 of the rotary chuck 56 is transparent and a heater 61 is arranged under the surface 60. In some examples, the heater 61 includes a plurality of light emitting diodes (LEDs) that are arranged in one or more radial zones to allow radial heating of the substrate 60. In some examples, the heater 61 can be operated to provide a moving heat wave that moves from a central location of the substrate outwardly to a radially outer edge thereof. In some examples, the rotary chuck 56 rotates and the heater 61 is stationary. Suitable examples of a rotary chuck performing radial heating of the substrate are shown and described in U.S. patent application Ser. No. 15/232,594.

In some examples, the rotary chuck 56 is rotated by a motor 62 via a drive shaft 63 as shown. In other examples, the motor 62 includes a rotor and stator and the rotor is driven magnetically without physical contact. Suitable examples are shown in commonly-assigned U.S. Pat. No. 6,485,531, which is hereby incorporated by reference in its entirety. Rinsing liquid is delivered by an arm 64 and a nozzle 66 that are scanned across the substrate 58 by a motor 70. A valve 72 selectively supplies the rinsing liquid from a liquid supply 74 to the arm 64.

Another arm 84 (shown in an inactive position in FIG. 2A) and a gas nozzle 86 may be used to deliver a gas mixture including one or more of hydrofluoric (HF) gas, carrier gas, and second reactive component (e.g. solvent vapor and/or ammonia ($NH_3$)) as will be described further below. In some examples, an outlet of the gas nozzle 86 is arranged within a predetermined distance of a surface of the substrate 58. In some examples, the predetermined distance is in a range from 1 mm to 40 mm. In some examples, the predetermined distance is in a range from 2 mm to 2 cm. In some examples, the gas mixture is delivered at a predetermined velocity in a range from 1 to 50 m/s. In some examples, the gas mixture is delivered at a predetermined flow in a range from 1 to 20 standard liters per minute (slm). In some examples, a cross-sectional area of an orifice of the nozzle 86 is in a range from 3 to 30 $mm^2$.

A motor 90 may be used to scan the nozzle 86 across the substrate 58 and a valve 92 may be used to selectively supply the gas mixture. A gas delivery system 100 includes a vapor supply 102 and a valve 104. In some examples, the vapor supply 102 includes a heated liquid ampoule, bubbler or other vaporizer. The gas delivery system 100 further includes one or more gas supplies 112-1, 112-2, . . . , and 112-N (collectively gas supplies 112) and valves 114-1, 114-2, . . . , and 114-N (collectively valves 114). An optional manifold 110 may be used to allow the gases and vapors to mix prior to delivery via the optional valve 92. In some examples, mass flow controllers (not shown) are provided to more precisely control the gases and/or solvent vapor. The chamber 52 is connected to a pump 96 via a valve 94. A controller 130 controls the valves, the motors and the gas delivery system 100.

In FIG. 2B, the arms 64 and 84 are shown in plan view. The arm 64 is shown in a dispensing position over the substrate 58 while the arm 84 is shown in an inactive position. The arm 64 dispenses the rinsing liquid onto the substrate and the rinsing liquid is spun off. After dispensing the rinsing liquid, the arm 64 is moved to the inactive position and the arm 84 dispenses the gas mixture as will be described further below Referring now to FIG. 2C, a rotary chuck with an open chamber can also be used. Additional details of an open chamber rotary chuck are shown in commonly-assigned U.S. Pat. No. 9,484,229, which is hereby incorporated by reference in its entirety. A rotary chuck 150 is arranged in a chamber 151 that is open at a top portion thereof. A bottom portion of the chamber 151 can be opened or closed. The chamber 151 defines one or more exhaust channels 152. In some examples, the one or more exhaust channels 152 are located in a plane including the substrate 58, are directed in a radially outward direction and are connected to a vacuum source. In some examples, the vacuum source includes a valve 153 and a pump 154 that are in fluid communication with the one or more exhaust channels 152.

In some examples, the rotary chuck 150 includes a plurality of gripping pins 155 arranged thereon and a transparent plate 156 arranged below the substrate 58. A heater 157 such as a printed circuit board including light emitting diodes (LEDs) may be arranged below the transparent plate 156 to heat the substrate 58. In some examples, the heater 157 produces a moving heat wave that is used during cleaning and/or repair. The moving heat wave moves from a central location of the substrate outwardly to a radially outer edge thereof. In some examples, the heater 157 is stationary and the rotary chuck 150 rotates. Suitable examples of a rotary chuck performing radial heating of the substrate are shown and described in U.S. patent application Ser. No. 15/232,594. In some examples, a fan 158 supplies airflow 159 to the top surface of the chamber 151 during processing.

Figure 3:
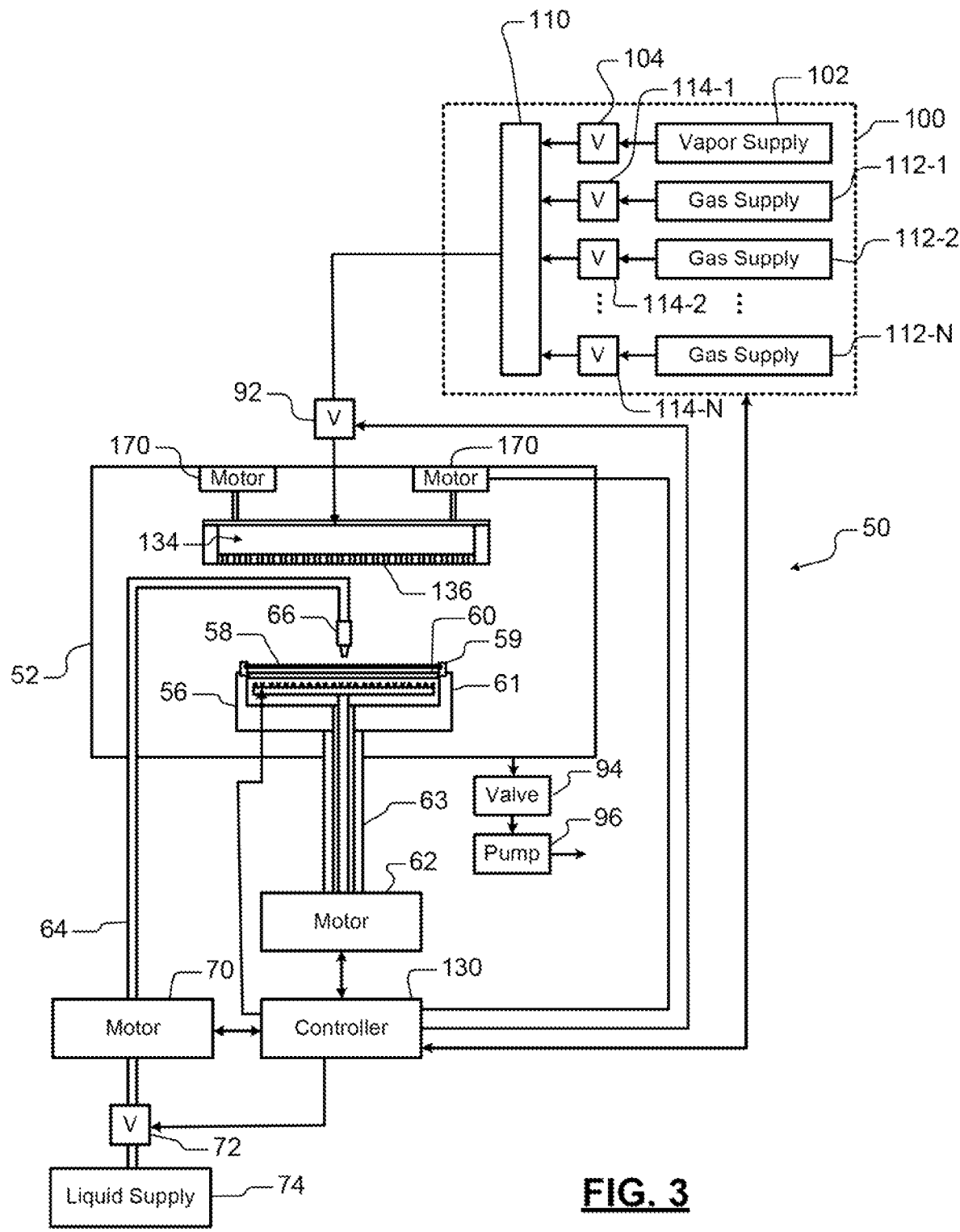
FIG. 3 is a functional block diagram of another example of a rotary chuck for processing a substrate according to the present disclosure.

Referring now to FIG. 3, another example of a rotary chuck for processing a substrate is shown. Instead of using the arm 84 and the nozzle 86, the gas mixture is dispensed using a showerhead 136 arranged above a surface of the substrate 58. Other suitable examples of a delivering gas through a showerhead onto a rotary chuck are shown and described in commonly-assigned U.S. Pat. No. 8,926,788 and commonly-assigned U.S. Patent Publication Nos. US2012/0131815 and US2014/0026926, which are hereby incorporated by reference in their entirety.

In some examples, the showerhead 136 includes a plate including a plurality of through holes. The gas mixture is delivered by the gas delivery system 100 and the valve 92 to a gas plenum 134. The gas mixture flows into the gas plenum 134, through the showerhead 136, and into the chamber 52 to expose the substrate 58. In some examples, a vertical position of the showerhead 136 and the gas plenum 134 is adjusted by one or more motors 170 to a location closer to the substrate prior to delivery of the gas mixture when repairing or preventing collapse.

Referring now to FIGS. 4-5, examples of methods for processing a substrate is shown. In FIG. 4, a method 180 for processing a substrate is shown. At 184 in FIG. 5, the substrate is arranged on the rotary chuck. At 188, the rotary chuck is rotated. At 192, rinsing liquid is dispensed onto the substrate. At 194, the rinsing liquid is spun off.

After a predetermined period (at 198), a gas mixture is supplied at 202. In other examples, the gas mixture can be applied in an overlapping manner during 194. The substrate can be either rotating or not rotating when applying the gas mixture.

In some examples, the predetermined period is in a range from 0 to 60 seconds. In some examples the gas mixture starts to be supplied before the rinsing step 192 has ended. In some examples, the gas mixture includes hydrofluoric (HF) gas and a carrier gas. The gas mixture is delivered for a predetermined period to prevent collapse and/or to repair HAR structures by removing bridging oxides.

In FIG. 5, a method 210 for processing a substrate is shown. Steps 184 to 198 are similar to those described above. After a predetermined period (198), a gas mixture is supplied at 214. The gas mixture includes hydrofluoric (HF) gas, a carrier gas and at least one of solvent vapor and ammonia gas. The gas mixture is delivered for a predetermined period to prevent collapse and/or to repair HAR structures. Without being limited to a particular theory, the collapse and/or to repair of the HAR structures occurs by directing HF gas onto the substrate to remove stiction forces such as Van der Waals forces, hydrogen bonds and covalent oxide bridges.

In one example, the repair process according to the present disclosure was tested on a substrate with HAR structures including nanopillars (silicon (Si) cylinders having a diameter of 30 nm, a pitch of 90 nm and a height of 600 nm). The repair process reduced the collapse percentage from almost 90% with the repair process according to the present disclosure to less than 10%.

Figure 8:
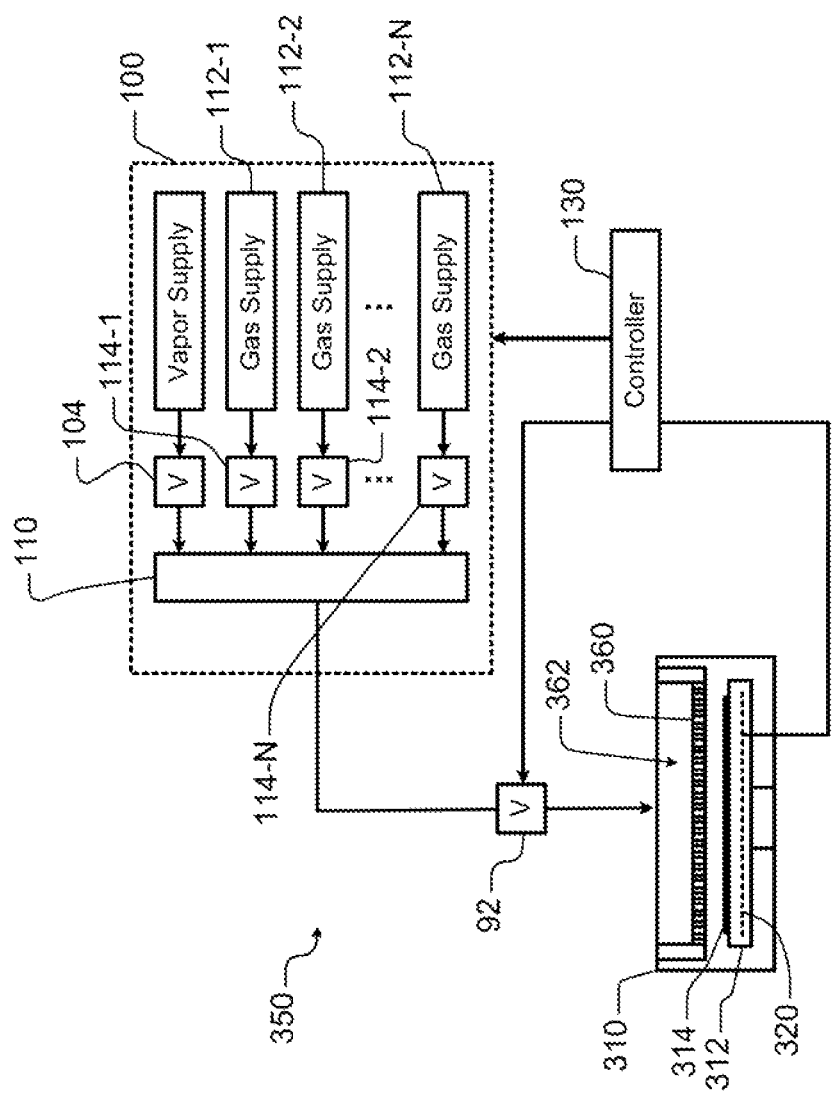
FIG. 8 is a functional block diagram of a collapse repair device utilizing a showerhead according to the present disclosure.

Referring now to FIGS. 6-8, wet processing and collapse repair can be performed in separate devices. In FIG. 6, a system 288 includes a wet processing device 290 that performs a wet processing step. After wet processing in the wet processing device 290, the substrate is moved to a collapse repair device 300. In some examples, the wet processing step includes wet cleaning. In some examples, the wet processing step is performed by a rotary chuck.

In FIG. 7, the collapse repair device 300 is shown. The collapse repair device 300 includes a chamber 310 and a substrate support 312 for supporting a substrate 314. The substrate support 312 includes a heater 320 such as a resistive heater and/or cooling channels to control a temperature of the substrate 314 during processing. The controller 130 controls the motor 90, the valve 92 and the gas delivery system 100 to perform collapse repair. Since the collapse repair device 300 does not perform wet cleaning, the nozzles and rotary chuck associated with wet processing device are omitted and the collapse repair device 300 can be simplified.

In FIG. 8, another example of a collapse repair device 350 is shown. The nozzle 86, the arm 84 and the motor 90 of the collapse repair device in FIG. 7 are replaced by a showerhead 360 arranged above a surface of the substrate 314. In some examples, the showerhead 360 includes a plate including a plurality of through holes. The gas mixture is delivered by the gas delivery system 100 and/or a valve 92 to a gas plenum 362. The gas mixture flows into the gas plenum 362 and through the showerhead 360 to expose the substrate 314.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A chamber for treating high aspect ratio (HAR) structures arranged on a surface of a substrate, comprising:
    a rotary chuck arranged in the chamber, wherein the chamber is open during processing;
    a first nozzle; and
    a second nozzle;
    a source of a gas mixture containing hydrogen fluoride;
    a source of ammonia; and
    a controller configured to:
    control rotation of the rotary chuck to rotate the substrate;
    control the first nozzle to dispense a first rinsing liquid to rinse the surface of the substrate in the chamber as the rotary chuck rotates the substrate while the interior of the chamber is at or near atmospheric pressure; and
    control the second nozzle to dispense the gas mixture containing hydrogen fluoride from the source and to direct the gas mixture onto the surface of the substrate in the chamber after the first rinsing liquid is dispensed while interior of the chamber is at or near atmospheric pressure; and
    add ammonia to the gas mixture in response to a processing temperature being greater than a predetermined temperature to inhibit formation of ammonium fluoride.

2. The chamber of claim 1, further comprising
    a first liquid dispenser connected to a first rinsing liquid source;
    a vapor supply to supply a second reactive component; and
    a gas dispenser connected to a gas source and the vapor supply to dispense the gas mixture onto the surface of the substrate.

3. The chamber of claim 2, further comprising a mixing manifold for mixing the gas mixture containing hydrogen fluoride and the second reactive component.

4. The chamber of claim 1, wherein the chamber is partially closed during the processing.

5. The chamber of claim 1, further comprising a vapor supply to supply a solvent vapor, wherein the gas mixture further contains the solvent vapor.

6. The chamber of claim 5, wherein the solvent vapor is selected from a group consisting of water vapor and alcohol vapor.

7. The chamber of claim 1, wherein the second nozzle directs the gas mixture containing hydrogen fluoride onto the surface of the substrate after the first rinsing liquid is spun off the substrate.

8. The chamber of claim 1, wherein the controller is configured to control the second nozzle to direct the gas mixture containing hydrogen fluoride onto the surface of the substrate within 60 seconds after the first rinsing liquid is dispensed.

9. The chamber of claim 1, further comprising a heater to heat the substrate to a temperature in a range from 20° C. to 400° C.

10. The chamber of claim 1, further comprising a heater to heat the substrate to a temperature in a range from 50° C. to 150° C.

11. The chamber of claim 1, wherein the substrate is maintained at a predetermined pressure in a range from 900 hPa to 1100 hPa.

12. The chamber of claim 1, further comprising a heater to heat the substrate to a temperature greater than 100° C.

13. The chamber of claim 1, wherein the second nozzle is located in a range from 1 mm to 40 mm from the surface of the substrate.

14. The chamber of claim 1, wherein the gas mixture is delivered from the second nozzle at a dispense velocity in a range from 1 to 50 m/s.

15. The chamber of claim 1, wherein the gas mixture is delivered from the second nozzle at a flow rate of 1 to 20 slm.

16. The chamber of claim 1, wherein a cross-sectional area of an orifice of the second nozzle is in a range from 3 to 30 mm².

17. The chamber of claim 1, wherein the first and second nozzles comprise first and second scanning nozzles, respectively, the chamber further comprising:
    first and second motors coupled to the first and second scanning nozzles, respectively,
    wherein the controller is configured to:
    control rotation of the rotary chuck to rotate the substrate;
    control the first motor to dispense the first rinsing liquid from the first scanning nozzle to rinse the surface of the substrate in the chamber with the interior of the chamber being at or near atmospheric pressure as the rotary chuck rotates the substrate; and
    control the second motor to dispense the gas mixture containing hydrogen fluoride from the second scanning nozzle and to direct the gas mixture onto the surface of the substrate in the chamber with the interior of the chamber being at or near atmospheric pressure after the first rinsing liquid is dispensed.

18. The chamber of claim 1, wherein the predetermined temperature is 100 degrees Celsius.

* * * * *